(12) United States Patent
Dhondse et al.

(10) Patent No.: US 11,934,891 B2
(45) Date of Patent: Mar. 19, 2024

(54) APIA CONFIGURATION USING AUTO-RATIONALIZATION AND MODELING

(71) Applicant: INTERNATIONAL BUSINESS MACHINES CORPORATION, Armonk, NY (US)

(72) Inventors: Amol Dhondse, Kothrud (IN); Dinesh G. Shetty, Sahakar Nagar (IN); Soumitra Limaye, Aundh (IN)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 105 days.

(21) Appl. No.: 17/179,383

(22) Filed: Feb. 18, 2021

(65) Prior Publication Data

US 2022/0261299 A1     Aug. 18, 2022

(51) Int. Cl.
*G06F 9/54* (2006.01)
*G06F 30/20* (2020.01)
*G06N 20/00* (2019.01)

(52) U.S. Cl.
CPC .............. *G06F 9/541* (2013.01); *G06F 30/20* (2020.01); *G06N 20/00* (2019.01)

(58) Field of Classification Search
CPC .......... G06F 9/541; G06F 30/20; G06N 20/00
See application file for complete search history.

(56) References Cited

U.S. PATENT DOCUMENTS 6,446,064 B1    9/2002    Livowsky
7,188,114 B2    3/2007    Liu et al.
(Continued)

FOREIGN PATENT DOCUMENTS

WO    2015065398 A1    5/2015

OTHER PUBLICATIONS

"Classifying an API instance into an Environment on API Manager," [online] MuleSoft LLC, a Salesforce company © 2020, retrieved Oct. 26, 2020, retrieved from the Internet: <https://docs.mulesoft.com/api-manager/2.x/classify-api-ask>, 7 pg.
(Continued)

*Primary Examiner* — Umut Onat
*Assistant Examiner* — Kimberly L Jordan
(74) *Attorney, Agent, or Firm* — 112978—Cuenot, Forsythe & Kim, LLC

(57) ABSTRACT

A computer hardware system includes a hardware processor configured to perform the following executable operations. A plurality of application programming interfaces (APIs) available to an organization are discovered. A cognitive classification is performed on the plurality of APIs to generate, for each of the plurality of APIs, an individual API data structure including API attribute information. A request for a particular API having a particular requirement is received via a configuration assistant and from a user. Candidate APIs are identified by generating an API interchangeability index using the individual API data structures and the particular requirement. Auto-rationalization is performed on the candidates APIs to identify a subset of the candidate APIs. The subset of the candidate APIs is presented to the user via the configuration assistant. A selected API is received from the user via the configuration assistant.

20 Claims, 5 Drawing Sheets

(56) References Cited

U.S. PATENT DOCUMENTS

| | | | |
|---|---|---|---|
| 7,209,876 | B2 | 4/2007 | Miller et al. |
| 7,904,480 | B2 | 3/2011 | Palanisamy |
| 8,015,051 | B2 | 9/2011 | Chen et al. |
| 8,099,709 | B2 | 1/2012 | Baikov et al. |
| 8,595,246 | B2 | 11/2013 | Fay et al. |
| 8,650,479 | B2 | 2/2014 | Jardine-Skinner et al. |
| 8,818,795 | B1 | 8/2014 | Cassimatis et al. |
| 9,015,730 | B1 | 4/2015 | Allen et al. |
| 9,639,404 | B2 | 5/2017 | Laredo et al. |
| 10,194,001 | B1 * | 1/2019 | Gardiner ............ H04L 67/10 |
| 10,503,569 | B2 | 12/2019 | Bharti et al. |
| 2010/0161629 | A1 | 6/2010 | Palanisamy et al. |
| 2016/0267153 | A1 * | 9/2016 | Witkop ............ G06F 21/6218 |
| 2016/0292018 | A1 | 10/2016 | Laredo et al. |
| 2019/0317842 | A1 | 10/2019 | Bharti et al. |
| 2020/0097338 | A1 | 3/2020 | Phondse et al. |
| 2020/0301760 | A1 * | 9/2020 | Janakiraman ............ G06F 8/36 |

OTHER PUBLICATIONS

Studer, R., "Semantic Service Discovery using Natural Language Queries," Doctoral Dissertation, Institute of Applied Informatics and Formal Description Methods AIFB, Karlsruhe Institute of Technology, SAP Research, 2009, 112 pg.

Contreras, P. et al., "Web Services in Natural Language: Towards an Integration of Web Service and Semantic Web Standards in the JXTA Peer to Peer Environment," [online] retrieved from the Internet: <http://thames.cs.rhul.ac.uk/~wstalk/papers/rhulpapers/orchestration.pdf>, May 18, 2005, 19 pg.

Lee, C. et al., "Context attributes: An approach to enable context-awareness for service discovery," In 2003 Proc. of Symposium on Applications and the Internet, Jan. 2003, pp. 22-30, IEEE.

Ahmed, S. et al., "Dynamic web service discovery model based on artificial neural network with QOS support," International Journal of Scientific and Engineering Research, vol. 3, No. 3, pp. 1-7, 2012.

Kirubakaran et al; Service Discovery Framework with Functional and Non-Functional Information (SDF), International Journal of Advanced Research in Computer Science and Software Engineering, vol. 2, Issue 12, Dec. 2012, pp. 206-210.

Yu, J. et al., "Web service discovery and dynamic invocation based on UDDI/OWL-S," In International Conference on Business Process Management, Sep. 2005, 9 pg., Springer, Berlin, Heidelberg.

Mell, P. et al., The NIST Definition of Cloud Computing, National Institute of Standards and Technology, U.S. Dept. of Commerce, Special Publication 800-145, Sep. 2011, 7 pg.

* cited by examiner

APIA CONFIGURATION USING AUTO-RATIONALIZATION AND MODELING

BACKGROUND

The present invention relates to application programming interfaces (API), and more specifically, to configuring APIs using auto-rationalization.

As part of their IT infrastructure, enterprises/organizations, such as companies and governmental entities, consume untold numbers of APIs and have access to even more. Accessible APIs can be found both internally, throughout many different units/domains of the organization, and externally, via vendors or otherwise accessible API libraries. As a result of the widespread availability of different APIs, application developers within an organization can experience choice overload when faced with selecting a particular API among many several seemingly near-identical choices.

SUMMARY

A method includes the following operations. A plurality of application programming interfaces (APIs) available to an organization are discovered. A cognitive classification is performed on the plurality of APIs to generate, for each of the plurality of APIs, an individual API data structure including API attribute information. A request for a particular API having a particular requirement is received via a configuration assistant and from a user. Candidate APIs are identified by generating an API interchangeability index using the individual API data structures and the particular requirement. Auto-rationalization is performed on the candidates APIs to identify a subset of the candidate APIs. The subset of the candidate APIs is presented to the user via the configuration assistant. A selected API is received from the user via the configuration assistant.

A system includes a hardware processor configured programmed to initiate the following executable operations. A plurality of application programming interfaces (APIs) available to an organization are discovered. A cognitive classification is performed on the plurality of APIs to generate, for each of the plurality of APIs, an individual API data structure including API attribute information. A request for a particular API having a particular requirement is received via a configuration assistant and from a user. Candidate APIs are identified by generating an API interchangeability index using the individual API data structures and the particular requirement. Auto-rationalization is performed on the candidates APIs to identify a subset of the candidate APIs. The subset of the candidate APIs is presented to the user via the configuration assistant. A selected API is received from the user via the configuration assistant.

A computer program product includes a computer readable storage medium having program code stored thereon. The program code causes a computer hardware system to perform the following operations. A plurality of application programming interfaces (APIs) available to an organization are discovered. A cognitive classification is performed on the plurality of APIs to generate, for each of the plurality of APIs, an individual API data structure including API attribute information. A request for a particular API having a particular requirement is received via a configuration assistant and from a user. Candidate APIs are identified by generating an API interchangeability index using the individual API data structures and the particular requirement. Auto-rationalization is performed on the candidates APIs to identify a subset of the candidate APIs. The subset of the candidate APIs is presented to the user via the configuration assistant. A selected API is received from the user via the configuration assistant.

This Summary section is provided merely to introduce certain concepts and not to identify any key or essential features of the claimed subject matter. Other features of the inventive arrangements will be apparent from the accompanying drawings and from the following detailed description.

DETAILED DESCRIPTION

Figure 1:
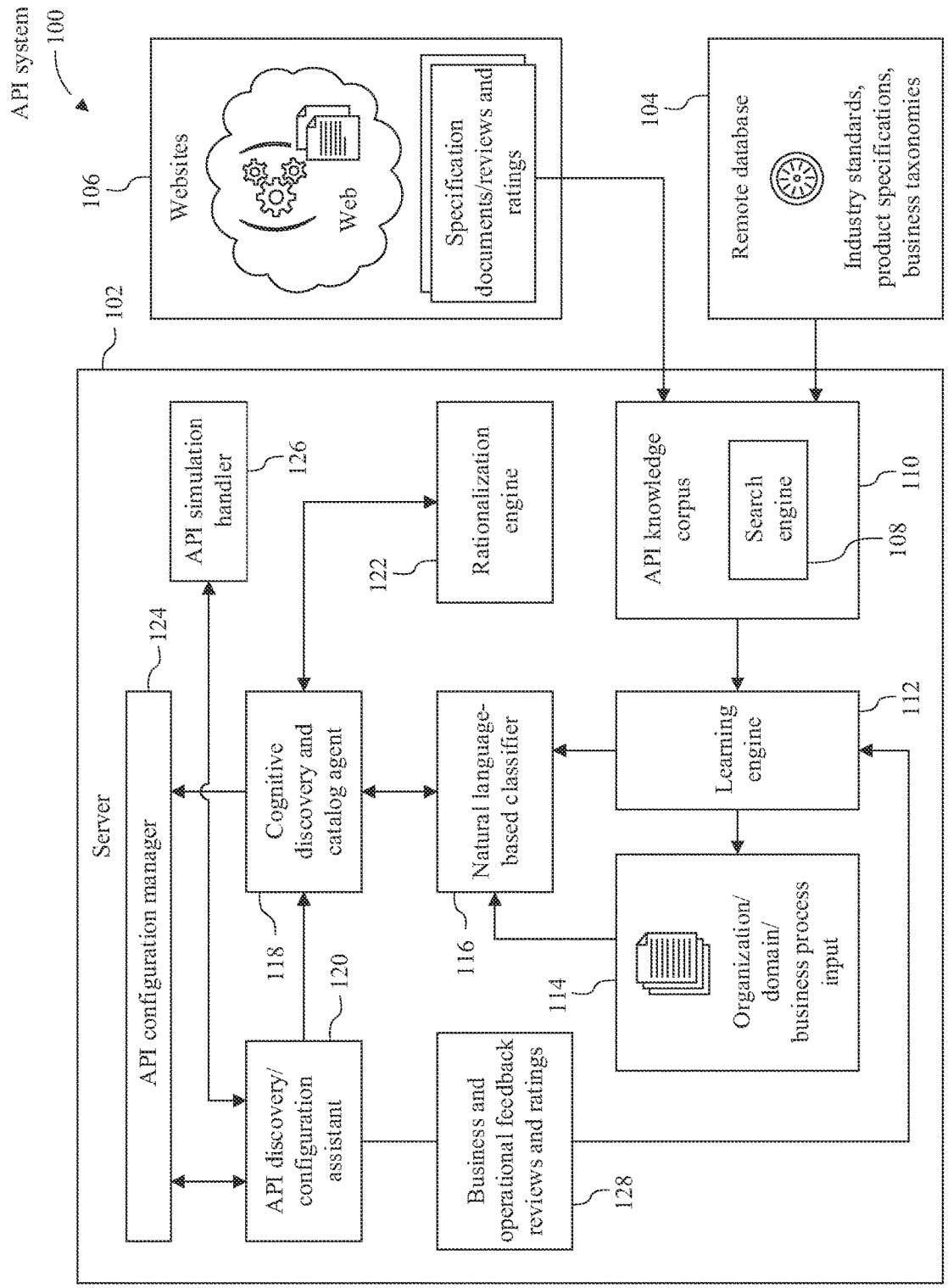
FIG. 1 is a block diagram illustrating an example of architecture for a processing system a network data processing system.
Figure 2:
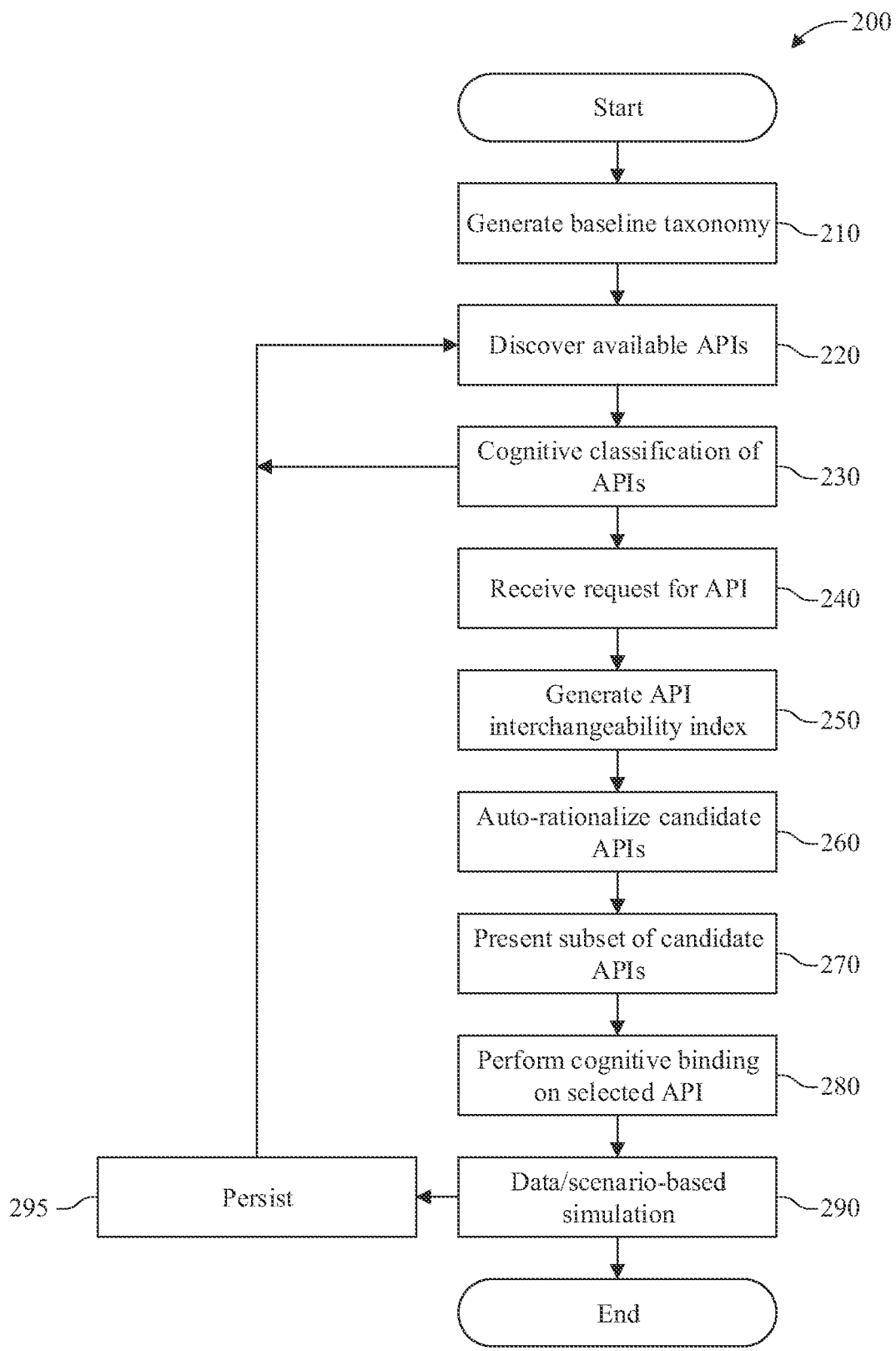
FIG. 2 is a block diagram illustrating an example method using the architecture of FIG. 1.

Reference is made to FIG. 1 and FIG. 2, which respectively illustrate an example API system 100 and methodology 200 of implementing certain aspects of the present disclosure.

In 210, the API system 100 generates a baseline taxonomy of available APIs using the API knowledge corpus 110, the machine learning modeler/learning engine 112, and the natural language-based classifier 116. The taxonomy represents a classification of the available APIs in a hierarchy structure. The present disclosure is not limited in the manner in which the baseline taxonomy is generated. In certain aspects, generation of the baseline taxonomy is performed using, for example, industry frameworks, industry taxonomies, and an enterprise taxonomy.

The baseline taxonomy can then be used to classify (or map) the discovered APIs using attribute information associated with each API. This mapping between APIs and the baseline taxonomy can be performed, for example, periodically or on demand. Classes of the baseline taxonomy can include, for example, industry, framework, and technology.

In 220, APIs available to the organization are discovered. This discovery can involve a server 102 searching remote databases 104 and websites 106 for information regarding available APIs in the marketplace and reference API attribute information. A search engine 108 associated with the API knowledge corpus 110 of the API system 100 is configured to crawl remote databases 104 of various API providers within a domain or industry to retrieve reference API attribute information, which includes API characteristics and features from API industry standards, API specifications, API literature, API metadata, and industry API taxonomies, for example. Search engine 108 is also configured to crawl websites 106 to retrieve reference API attribute information from API articles, API blogs, API reviews, and API ratings, for example.

The search engine 108 collects and stores the retrieved reference API attribute information in the API knowledge corpus 110. Each individual API can be associated with a particular API data structure. In certain aspects, the API knowledge corpus 110 is a query-enabled repository of API specifications, documents, industry API taxonomies, and related information, such as API usage statistics, reviews, and the like.

The machine learning modeler 112 is configured to receive the reference API attribute information from the API knowledge corpus 110 on a periodic or on-demand basis, for example, for analysis and learning. The machine learning modeler 112 is also configured to receive organizational, domain, or business process input 114 regarding APIs. In certain aspects, the machine learning modeler 112 is configured to perform cognitive concept and entity extraction from collected API corpus and literature using entity-relationship analysis and natural language learning models. The machine learning modeler 112 is also configured to perform API annotation and metadata enrichment based on extracted concepts and relationships. In certain aspects, the machine learning modeler 112 is responsible for input parameter vectorization based on extracted concept relationships and ground truths.

The machine learning modeler 112 is configured to gain API knowledge over time by extracting key attributes/features of APIs from documentation, sorting the data, and analyzing API performance. Machine learning modeler 112 is also capable of capturing relationships between different APIs. Machine learning modeler 112 sends extracted attribute/feature information corresponding to APIs to the natural language-based classifier 116.

In 230, a cognitive classification of the discovered APIs is performed. This includes the natural language-based classifier (NLC) 116 utilizing natural language processing and machine learning to place the APIs into different classes of APIs based on features of each respective API. The natural language-based classifier 116 is configured to perform cognitive classification based on collected API metadata and functional/nonfunctional characteristics. Natural language-based classifier 116 is capable of executing natural language driven deep learning models to classify APIs, using the baseline taxonomy, based on domain taxonomy and business function/process alignment. These classifications are included within the individual API data structures.

A cognitive discovery and cataloging agent 118 uses cognitive classification to generate a catalog of APIs across one or more API providers, with groups/sub-groups driven by similar functional and non-functional API features. The cognitive discovery cataloging and cataloging agent 118 uses factors contained within the API data structure, such as technology, sub-technology, industry associated with sub-technology, frequency of updating, domain, and metadata of API. The API configuration manager 124 generates insights from the cognitive discovery and cataloging agent 118.

The API data structure can include API attribute information such as technology, industries, domains, and sub-domains associated with a particular API. The API data structure can also be associated with prior feedback 128, as discussed above. The API data structure can include and/or refer to API metadata. An example of metadata associated with an API is a Swagger file, which describes the structure of the API. Information contained in a Swagger file includes, for example, the operations supported by the API, parameters consumed by the API, responses produced by the API, endpoints of the PAI, and what kind of authorization is used by the API. Other aspects of the API data structure can include information such as created date and updated date.

In 240, API discovery and configuration assistant 120 provides a user interface, such as a graphical user interface, that is configured, for example, to allow API sponsors, administrators, and operations to request APIs based upon particular requirements. API discovery and configuration assistant 120 provides an interactive dashboard where API owners/sponsors can submit requests for a particular API and view API recommendations. For example, a request for a particular API having a particular requirement may include an API administrator speaking or typing "API that returns all products based on category 'apparel,' definitely providing filtering by 'brand' and preferably sorted by 'size' and 'color'" and then speak or type "it would also be helpful if the API can first return apparel that are popular as 'seasonal offerings' or are 'designer specials.'"

The API system 100 includes a rationalization engine 122. The rationalization engine 122 begins by identifying a set of candidate APIs from the previously-identified available APIs based upon the user's requirements. The rationalization engine 122 then proceeds to refine this set of candidate APIs using one or more various techniques.

In 250, one technique to refine the set of candidate APIs involves the generation of an API interchangeability index, which is a result of a tree sorting algorithm using factors such as the particular requirements provided by the end user and characteristics of the enterprise/organization. The API interchangeability index is used to identify relevant APIs in real-time for enterprise-specific persona. This API interchangeability index can be unique and change based on characteristics of the enterprise or end user. Based upon a user-selected or predefined threshold criteria, the candidate APIs within the interchangeability index can be further refined. For example, all APIs that do not meet the threshold criteria are discarded and the remaining APIs are presented to the user via the API discovery and configuration assistant 120.

The API interchangeability index score can be a numerical value that is derived based on information such as a score of APIs, personality insights, among others. The API interchangeability index score can also be calculated and derived as part of outputs from different components. This API interchangeability index score is a relative score based on associations of a particular API with a request user, such as an enterprise and/or persona. The API interchangeability index score for a particular API can also be derived from factors such as usability of the API in industry, feedback 128 associated with the API, rating of the API developers/enterprises.

The API interchangeability index score can be calculated by leveraging supervised training for assisted discovery and configuration management based on rationalization of similar APIs from existing or new APIs from various providers using machine learning. The API interchangeability index score can also be derived by different machine learning models. For example, each API can have a benchmark interchangeability index score while the API at the time of onboarding, API interchangeability score can be further augmented based on feedback 128 from different components and this score is also self-adjusted by the rationalization engine based 122 on machine learning models comparing different API's in similar areas, score of these APIs, among others. Also, the interchangeability index score can be based upon historical usage/feedback and evolving domain corpus, as well as extensibility and reuse at atomic level (person/organization/product) and aggregated level such as likes/dislikes gathered from external sources.

Another technique to refine the set of candidate API involves using feedback 128 associated with the individual APIs. This technique uses past feedback 128 provided by other users in combination with the user's persona and/or the organization's characteristic to determine what API better.

The feedback 128 can take many forms. For example, the feedback 128 can be positive or negative sentiments (e.g., likes or dislikes) associated with a particular API found. These sentiments can either be locally generated or found in third-party databases. An additional form of feedback 128 can be past selection and/or past usage of the API by other users employing the present system 100. This information can include when an API is suggested to a user and the API is subsequently leveraged by a user as well as instances when an API is suggested to a user and the user chooses not to leverage suggested API. As feedback 128 is developed, which is discussed in more detail with to operation 295, the rationalization engine 122 can persist this feedback 128 in the individual API data structures and subsequently use this feedback 128 in the generation of the interchangeability index. Another type of feedback 128 is the specific solution in which the API is used. As used here, a "solution" refers to the entire application/offering/asset that would be built using the suggested API not just input/output around the API. This also includes binding APIs specific to an application and self-adjusting, which involves recommending one or more parameters to be tuned specific to an application.

In 260, yet another technique to refine the set of candidate APIs involves the rationalization of the candidate APIs. Rationalization (or auto-rationalization, i.e., automatic rationalization) is a process that involves identifying functionally duplicate APIs and then identifying one of those functionally duplicate APIs to remain within the set candidate APIs and removing the other functional duplicate APIs from the set of candidate APIs. The system 100 is not limited in the manner in which this accomplished. In certain aspects, functionally duplicate APIs are identified using machine learning models that can use a number of different factors. These factors can include but are not limited to information associated with the user and/or organization, domain and industry standards, business taxonomies, and process/case history. Rationalization of an API portfolio can be based on a business context via continuous self-learning process using deep learning techniques and natural language classification from contextual input, including business process or case information, using machine learning algorithms to recognize and match patterns in the input with API related documentation, metadata, usage feedback. API(s) found useful to organization/domain most recently will have a better chance of being retained and matched with other similar API(s).

In 270, the APIs identified as relevant by the rationalization engine 122 are presented to the user as a subset of the candidate APIs via the user interface associated with the API discovery and configuration assistant 120. The assistant 120, for example, can identify each API in the subset of APIs along with relevant metadata of the API and a relevancy score of the API for a particular enterprise and/or end user, with the relevancy score reflecting how relevant the API is to the particular requirements of the particular enterprise and/or end user.

In 280, after a user has selected one of the APIs presented to the user by the assistant 120, an API simulation handler 126 and sampler can perform cognitive binding on the selected one of the APIs. Cognitive binding can include, for example, associating relevant APIs that were recommended to the user/enterprise by dynamically passing information such as end points, gateway details, client id/secret, bearer token and/or by making specific adjustments relevant to solution or application that is being developed.

In 290, the API simulation handler 126 performs simulations on the selected API to determine whether the API works for the particular solution identified by the user. As used herein, a "solution" refers to the entire application and includes not only input/output associated with the API but also binding API's specific to the application. The solution also includes self-adjusting recommendations for tuning parameters specific to the application. The API simulation handler 126 is configured to perform cognitive binding based on a particular application and identify a type of simulation to be leveraged and recommended to the user/enterprise. The simulations performed on the selected API(s) are not limited. For example, the API simulation handler 126 can performed a data-based simulation or a scenario-based simulation. A data-based simulation can involve using training/test data. A scenario-based simulation involves using a user-based scenario, which involves using the API in the manner intended by the user. Based on feedback 128 regarding a particular API during the process of building the application for user, the feedback 128 can be leveraged for adjusting a relevancy score of a particular API and/or adjusting the API interchangeability index.

In 295, the API simulation handler 126 in conjunction with the rationalization engine 122 can persist information associated with the simulations and the user's selection of a particular API. This information, stored within the individual API data structure for the particular API, can be used both during subsequently cognitive classification of the API and generating an API interchangeability index for the API. In this manner, the system engages in a continuous learning process.

As defined herein, the term "responsive to" means responding or reacting readily to an action or event. Thus, if a second action is performed "responsive to" a first action, there is a causal relationship between an occurrence of the first action and an occurrence of the second action, and the term "responsive to" indicates such causal relationship.

As defined herein, the term "processor" means at least one hardware circuit (e.g., an integrated circuit) configured to carry out instructions contained in program code. Examples of a processor include, but are not limited to, a central processing unit (CPU), an array processor, a vector processor, a digital signal processor (DSP), a field-programmable gate array (FPGA), a programmable logic array (PLA), an application specific integrated circuit (ASIC), programmable logic circuitry, and a controller.

As defined herein, the term "server" means a data processing system configured to share services with one or more other data processing systems.

As defined herein, the term "client device" means a data processing system that requests shared services from a server, and with which a user directly interacts. Examples of a client device include, but are not limited to, a workstation, a desktop computer, a computer terminal, a mobile computer, a laptop computer, a netbook computer, a tablet computer, a smart phone, a personal digital assistant, a smart watch, smart glasses, a gaming device, a set-top box, a smart television and the like. Network infrastructure, such as routers, firewalls, switches, access points and the like, are not client devices as the term "client device" is defined herein.

As defined herein, the term "real time" means a level of processing responsiveness that a user or system senses as sufficiently immediate for a particular process or determination to be made, or that enables the processor to keep up with some external process.

As defined herein, the term "automatically" means without user intervention.

As defined herein, the term "user" means a person (i.e., a human being).

The communication network 150 is the medium used to provide communications links between various devices and data processing systems connected together within the API system 100/computing environment (or network data processing system, etc.) 100. The communication network 150 may include connections, such as wire, wireless communication links, or fiber optic cables. The communication network 150 can be implemented as, or include, any of a variety of different communication technologies such as a wide area network (WAN), a local area network (LAN), a wireless network, a mobile network, a Virtual Private Network (VPN), the Internet, the Public Switched Telephone Network (PSTN), or similar technologies.

Figure 3:
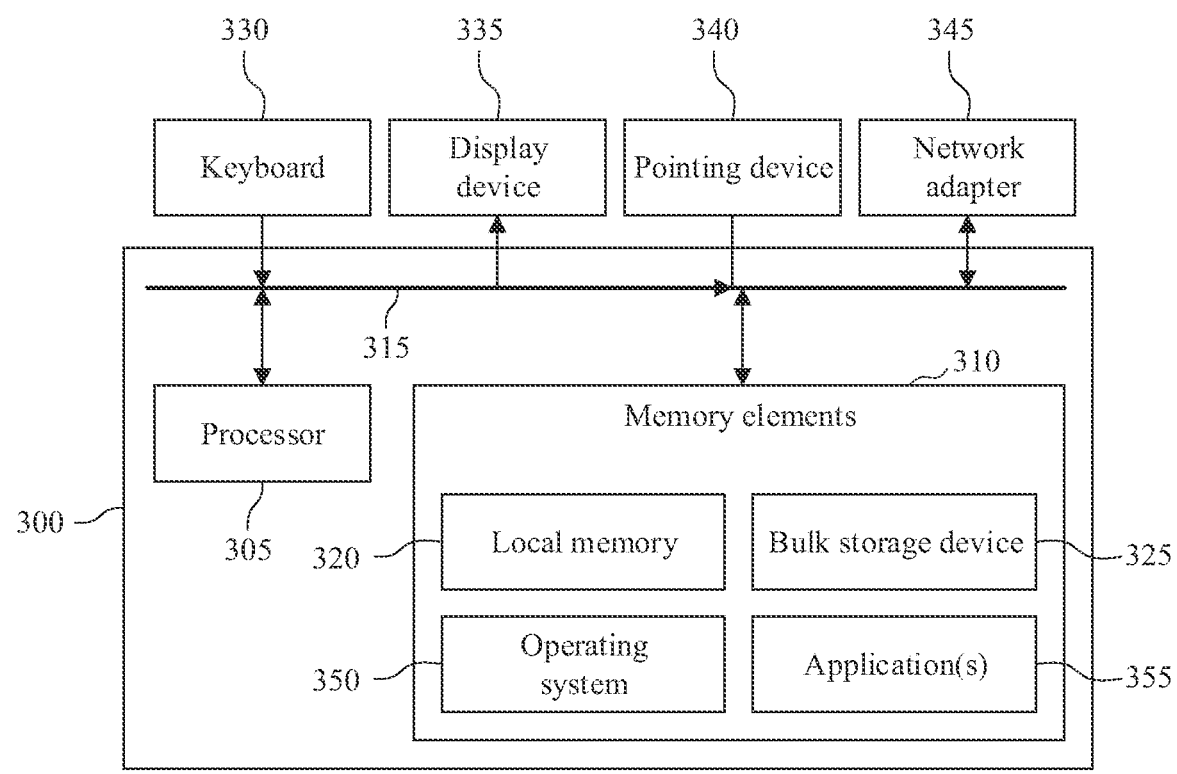
FIG. 3 is a block diagram illustrating an example of computer hardware system for implementing the processing system of FIG. 1.

FIG. 3 is a block diagram illustrating example architecture for a data processing system 300. The data processing system 300 can include at least one processor 305 (e.g., a central processing unit) coupled to memory elements 310 through a system bus 315 or other suitable circuitry. As such, the data processing system 300 can store program code within the memory elements 310. The processor 305 can execute the program code accessed from the memory elements 310 via the system bus 315. It should be appreciated that the data processing system 300 can be implemented in the form of any system including a processor and memory that is capable of performing the functions and/or operations described within this specification. For example, the data processing system 300 can be implemented as a server, a plurality of communicatively linked servers, a workstation, a desktop computer, a mobile computer, a tablet computer, a laptop computer, a netbook computer, a smart phone, a personal digital assistant, a set-top box, a gaming device, a network appliance, and so on.

The memory elements 310 can include one or more physical memory devices such as, for example, local memory 320 and one or more bulk storage devices 325. Local memory 320 refers to random access memory (RAM) or other non-persistent memory device(s) generally used during actual execution of the program code. The bulk storage device(s) 325 can be implemented as a hard disk drive (HDD), solid state drive (SSD), or other persistent data storage device. The data processing system 300 also can include one or more cache memories (not shown) that provide temporary storage of at least some program code in order to reduce the number of times program code must be retrieved from the local memory 320 and/or bulk storage device 325 during execution.

Input/output (I/O) devices such as a display 330, a pointing device 335 and, optionally, a keyboard 340 can be coupled to the data processing system 300. The I/O devices can be coupled to the data processing system 300 either directly or through intervening I/O controllers. For example, the display 330 can be coupled to the data processing system 300 via a graphics processing unit (GPU), which may be a component of the processor 305 or a discrete device. One or more network adapters 345 also can be coupled to data processing system 300 to enable the data processing system 300 to become coupled to other systems, computer systems, remote printers, and/or remote storage devices through intervening private or public networks. Modems, cable modems, transceivers, and Ethernet cards are examples of different types of network adapters 345 that can be used with the data processing system 300.

As pictured in FIG. 3, the memory elements 310 can store the components of the API system 100 of FIG. 1. Being implemented in the form of executable program code, these components of the data processing system 300 can be executed by the data processing system 500 and, as such, can be considered part of the data processing system 300.

It is to be understood that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as Follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as Follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as Follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Figure 4:
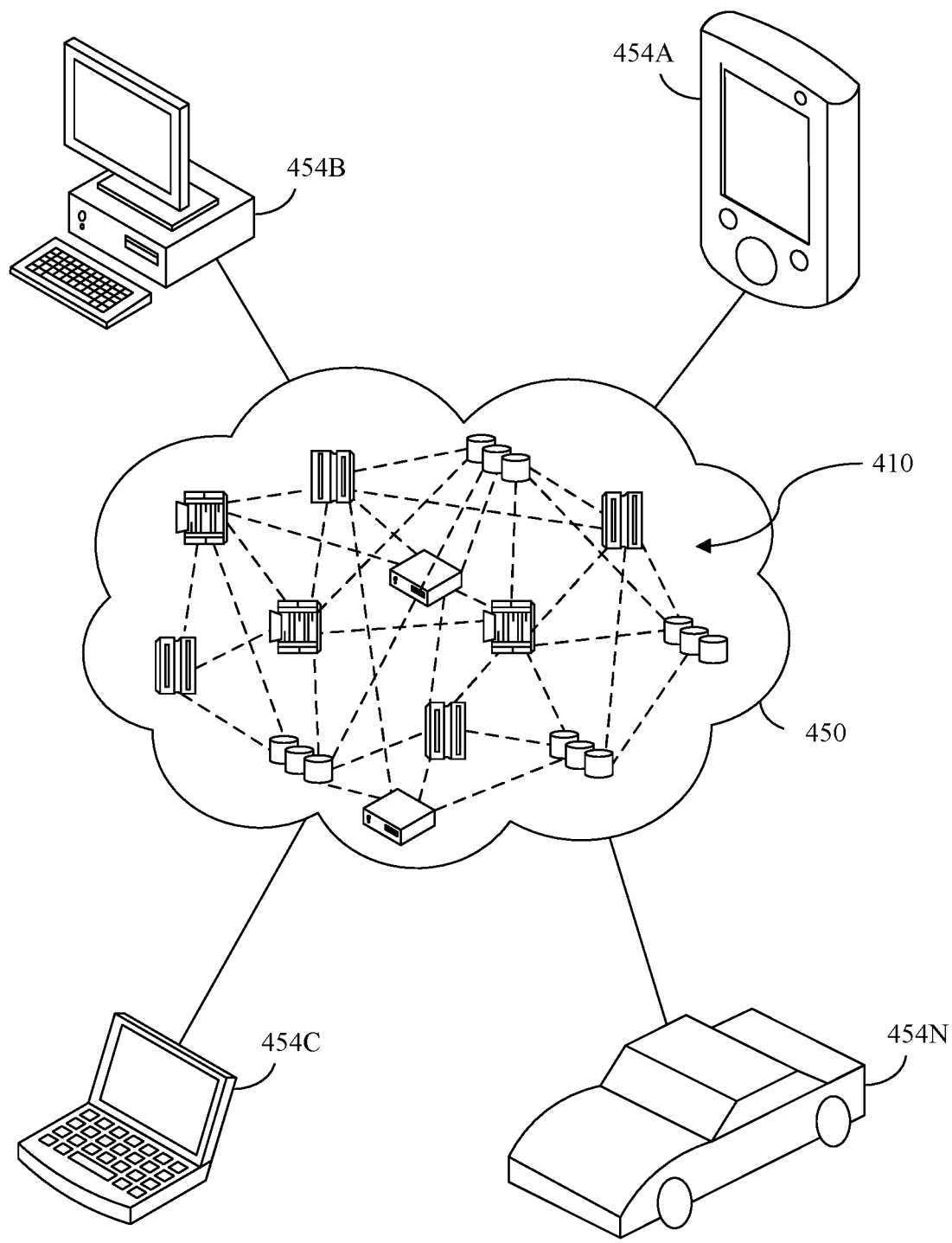
FIG. 4 depicts a cloud computing environment according to an embodiment of the present invention.

Referring now to FIG. 4, illustrative cloud computing environment 450 to be used with the API system 100 is depicted. As shown, cloud computing environment 450 includes one or more cloud computing nodes 410 with which local computing devices used by cloud consumers, such as, for example, personal digital assistant (PDA) or cellular telephone 454A, desktop computer 454B, laptop computer 454C, and/or automobile computer system 454N may communicate. Nodes 410 may communicate with one another. They may be grouped (not shown) physically or virtually, in one or more networks, such as Private, Community, Public, or Hybrid clouds as described hereinabove, or a combination thereof. This allows cloud computing environment 450 to offer infrastructure, platforms and/or software as services for which a cloud consumer does not need to maintain resources on a local computing device. It is understood that the types of computing devices 454A-N shown in FIG. 4 are intended to be illustrative only and that computing nodes 410 and cloud computing environment 450 can communicate with any type of computerized device over any type of network and/or network addressable connection (e.g., using a web browser).

Figure 5:
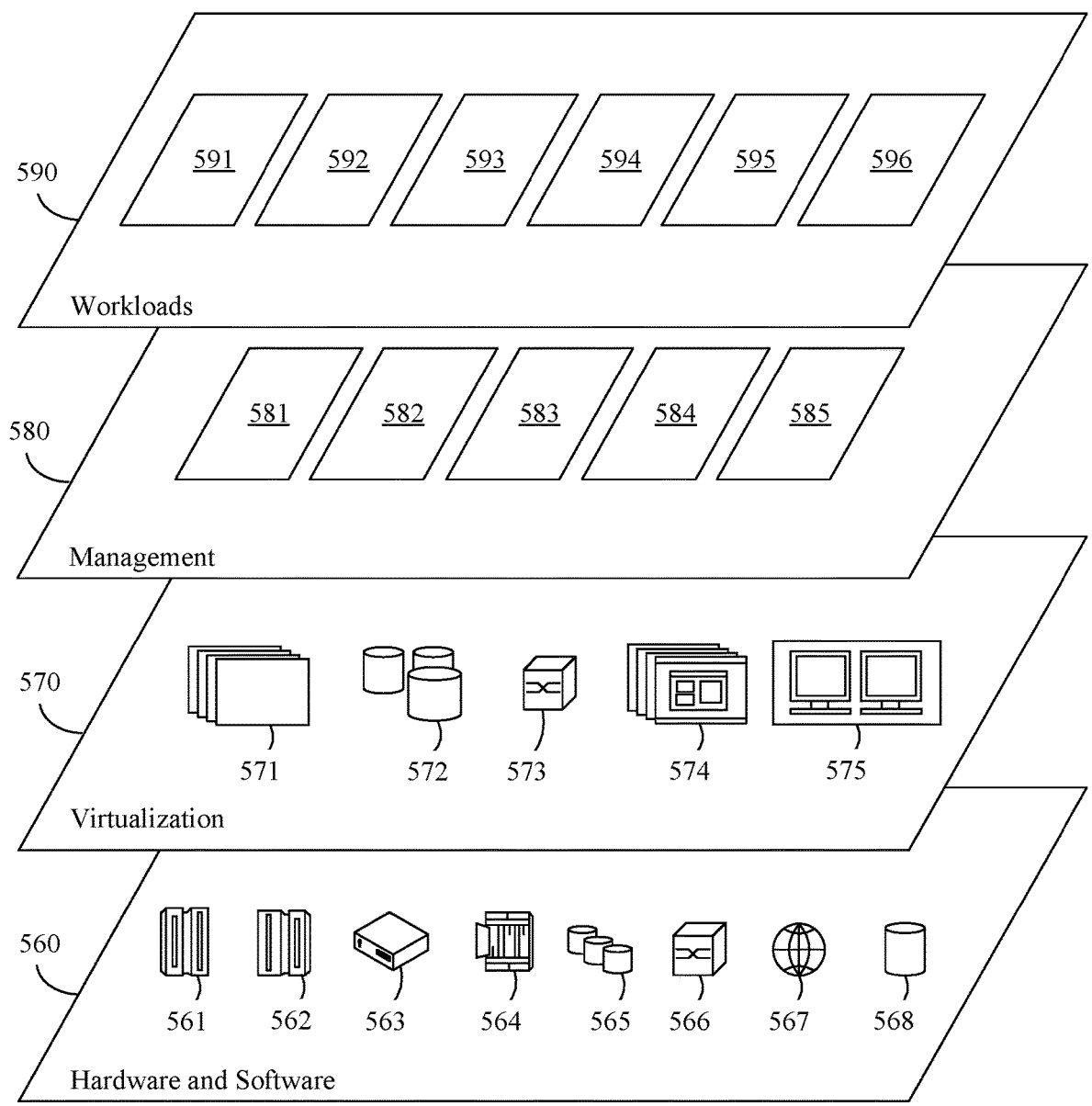
FIG. 5 depicts abstraction model layers according to an embodiment of the present invention.

Referring now to FIG. 5, a set of functional abstraction layers provided by cloud computing environment 450 (FIG. 4) is shown. It should be understood in advance that the components, layers, and functions shown in FIG. 5 are intended to be illustrative only and embodiments of the invention are not limited thereto. As depicted, the following layers and corresponding functions are provided:

Hardware and software layer 560 includes hardware and software components. Examples of hardware components include: mainframes 561; RISC (Reduced Instruction Set Computer) architecture based servers 562; servers 563; blade servers 564; storage devices 565; and networks and networking components 566. In some embodiments, software components include network application server software 567 and database software 568.

Virtualization layer 570 provides an abstraction layer from which the following examples of virtual entities may be provided: virtual servers 571; virtual storage 572; virtual networks 573, including virtual private networks; virtual applications and operating systems 574; and virtual clients 575.

In one example, management layer 580 may provide the functions described below. Resource provisioning 581 provides dynamic procurement of computing resources and other resources that are utilized to perform tasks within the cloud computing environment. Metering and Pricing 582 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 583 provides access to the cloud computing environment for consumers and system administrators. Service level management 584 provides cloud computing resource allocation and management such that required service levels are met. Service Level Agreement (SLA) planning and fulfillment 585 provide pre-arrangement for, and procurement of, cloud computing resources for which a future requirement is anticipated in accordance with an SLA.

Workloads layer 590 provides examples of functionality for which the cloud computing environment may be utilized. Examples of workloads and functions which may be provided from this layer include: mapping and navigation 591; software development and lifecycle management 592; virtual classroom education delivery 593; data analytics processing 594; transaction processing 595; and operations of the API system 596.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions. The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "includes," "including,"

"comprises," and/or "comprising," when used in this disclosure, specify the presence of stated features, integers, steps, operations, elements, and/or components, but do not preclude the presence or addition of one or more other features, integers, steps, operations, elements, components, and/or groups thereof.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "includes," "including," "comprises," and/or "comprising," when used in this disclosure, specify the presence of stated features, integers, steps, operations, elements, and/or components, but do not preclude the presence or addition of one or more other features, integers, steps, operations, elements, components, and/or groups thereof.

Reference throughout this disclosure to "one embodiment," "an embodiment," "one arrangement," "an arrangement," "one aspect," "an aspect," or similar language means that a particular feature, structure, or characteristic described in connection with the embodiment is included in at least one embodiment described within this disclosure. Thus, appearances of the phrases "one embodiment," "an embodiment," "one arrangement," "an arrangement," "one aspect," "an aspect," and similar language throughout this disclosure may, but do not necessarily, all refer to the same embodiment.

The term "plurality," as used herein, is defined as two or more than two. The term "another," as used herein, is defined as at least a second or more. The term "coupled," as used herein, is defined as connected, whether directly without any intervening elements or indirectly with one or more intervening elements, unless otherwise indicated. Two elements also can be coupled mechanically, electrically, or communicatively linked through a communication channel, pathway, network, or system. The term "and/or" as used herein refers to and encompasses any and all possible combinations of one or more of the associated listed items. It will also be understood that, although the terms first, second, etc. may be used herein to describe various elements, these elements should not be limited by these terms, as these terms are only used to distinguish one element from another unless stated otherwise or the context indicates otherwise.

The term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The foregoing description is just an example of embodiments of the invention, and variations and substitutions. While the disclosure concludes with claims defining novel features, it is believed that the various features described herein will be better understood from a consideration of the description in conjunction with the drawings. The process (es), machine(s), manufacture(s) and any variations thereof described within this disclosure are provided for purposes of illustration. Any specific structural and functional details described are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

What is claimed is:

1. A computer-implemented process, comprising:
   discovering a plurality of application programming interfaces (APIs) available to an organization;
   performing a cognitive classification on the plurality of APIs to generate, for each of the plurality of APIs, an individual API data structure including API attribute information;
   receiving, via a configuration assistant and from a user, a request for a particular API having a particular requirement;
   identifying candidate APIs by generating an API interchangeability index using the individual API data structures and the particular requirement;
   performing auto-rationalization on the candidate APIs to identify a subset of the candidate APIs;
   presenting, via the configuration assistant and to the user, the subset of the candidate APIs; and
   receiving, from the user and via the configuration assistant and from the subset of the candidate APIs, a selected API, wherein
   the API interchangeability index includes a plurality of API interchangeability scores that measure an interchangeability of the particular API, and
   the auto-rationalization identifies one of a plurality of functionally-duplicate APIs to remain within the subset of the candidate APIs and deletes other ones of the plurality of functional-duplicate APIs from the candidate APIs.

2. The method of claim 1, wherein
   the API interchangeability index includes an API interchangeability score for each of the candidate APIs, mappings between the candidate APIs, and a rationalization score for each of the candidate APIs.

3. The method of claim 2, wherein
   the API interchangeability score for the particular API is generated based upon scores of similar APIs in a same domain, prior feedback for the particular API, and characteristics of the user.

4. The method of claim 1, wherein
   the auto-rationalization includes identifying functionally-equivalent APIs.

5. The method of claim 1, further comprising:
   performing cognitive binding on the selected API.

6. The method of claim 1, further comprising:
   performing a simulation on the selected API.

7. The method of claim 6, wherein
   an API data structure for the selected API is updated based upon the simulation.

8. The method of claim 6, wherein
   the simulation is data based.

9. The method of claim 6, wherein
   the simulation is event based.

10. A computer hardware system, comprising:
    a hardware processor configured to perform the following executable operations:
      discovering a plurality of application programming interfaces (APIs) available to an organization;
      performing a cognitive classification on the plurality of APIs to generate, for each of the plurality of APIs, an individual API data structure including API attribute information;
      receiving, via a configuration assistant and from a user, a request for a particular API having a particular requirement;
      identifying candidate APIs by generating an API interchangeability index using the individual API data structures and the particular requirement;
      performing auto-rationalization on the candidate APIs to identify a subset of the candidate APIs;
      presenting, via the configuration assistant and to the user, the subset of the candidate APIs; and
      receiving, from the user and via the configuration assistant and from the subset of the candidate APIs, a selected API, wherein
    the API interchangeability index includes a plurality of API interchangeability scores that measure an interchangeability of the particular API, and
    the auto-rationalization identifies one of a plurality of functionally-duplicate APIs to remain within the subset of the candidate APIs and deletes other ones of the plurality of functional-duplicate APIs from the candidate APIs.

11. The system of claim 10, wherein
    the API interchangeability index includes an API interchangeability score for each of the candidate APIs, mappings between the candidate APIs, and a rationalization score for each of the candidate APIs.

12. The system of claim 11, wherein
the API interchangeability score for the particular API is generated based upon scores of similar APIs in a same domain, prior feedback for the particular API, and characteristics of the user.

13. The system of claim 10, wherein
the auto-rationalization includes identifying functionally-equivalent APIs.

14. The system of claim 10, wherein the hardware processor is further configured to perform:
performing cognitive binding on the selected API.

15. The system of claim 10, wherein the hardware processor is further configured to perform:
performing a simulation on the selected API.

16. The system of claim 15, wherein
an API data structure for the selected API is updated based upon the simulation.

17. The system of claim 15, wherein
the simulation is data based.

18. The system of claim 15, wherein
the simulation is event based.

19. A computer program product, comprising:
a computer readable storage medium having stored therein program code,
the program code, which when executed by a computer hardware system, cause the computer hardware system to perform:
discovering a plurality of application programming interfaces (APIs) available to an organization;
performing a cognitive classification on the plurality of APIs to generate, for each of the plurality of APIs, an individual API data structure including API attribute information;
receiving, via a configuration assistant and from a user, a request for a particular API having a particular requirement;
identifying candidate APIs by generating an API interchangeability index using the individual API data structures and the particular requirement;
performing auto-rationalization on the candidate APIs to identify a subset of the candidate APIs;
presenting, via the configuration assistant and to the user, the subset of the candidate APIs; and
receiving, from the user and via the configuration assistant and from the subset of the candidate APIs, a selected API, wherein
the API interchangeability index includes a plurality of API interchangeability scores that measure an interchangeability of the particular API, and
the auto-rationalization identifies one of a plurality of functionally-duplicate APIs to remain within the subset of the candidate APIs and deletes other ones of the plurality of functional-duplicate APIs from the candidate APIs.

20. The computer program product of claim 19, wherein
the API interchangeability index includes an API interchangeability score for each of the candidate APIs, mappings between the candidate APIs, and a rationalization score for each of the candidate APIs.

* * * * *